(12) United States Patent
Fan

(10) Patent No.: US 8,544,860 B2
(45) Date of Patent: Oct. 1, 2013

(54) RACK FOR ELECTRONIC APPARATUS

(75) Inventor: Chen-Lu Fan, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 405 days.

(21) Appl. No.: 12/961,288

(22) Filed: Dec. 6, 2010

(65) Prior Publication Data

US 2012/0013092 A1 Jan. 19, 2012

(30) Foreign Application Priority Data

Jul. 19, 2010 (CN) .......................... 2010 1 0230291

(51) Int. Cl.
*B62B 1/00* (2006.01)
*A47B 3/06* (2006.01)

(52) U.S. Cl.
USPC .. 280/79.3; 280/639; 280/47.26; 108/158.12; 248/128

(58) Field of Classification Search
USPC ............... 280/35, 47.34–47.35, 79.11, 47.26, 280/639, 42, 79.3; 108/158.12, 12, 26, 57.15; 248/128, 129, 298.1
See application file for complete search history.

(56) References Cited

U.S. PATENT DOCUMENTS

| | | | | |
|---|---|---|---|---|
| 5,931,149 | A * | 8/1999 | Lewis | 126/41 R |
| 7,857,329 | B2 * | 12/2010 | Cai | 280/47.35 |
| 2004/0070174 | A1 * | 4/2004 | Cortez | 280/495 |

* cited by examiner

*Primary Examiner* — J. Allen Shriver, II
*Assistant Examiner* — James Triggs
(74) *Attorney, Agent, or Firm* — Altis & Wispro Law Group, Inc.

(57) ABSTRACT

A rack includes a lower frame and a stand member. A wheel is mounted on the lower frame. The stand member includes a base and a connecting plate. The connecting plate is secured to the lower frame. The base is higher than a bottom of the wheel to stabilize the rack during transport.

16 Claims, 5 Drawing Sheets

RACK FOR ELECTRONIC APPARATUS

BACKGROUND

1. Technical Field

The present disclosure relates to racks, and particularly to a rack for an electronic apparatus.

2. Description of Related Art

Certain computer systems, such as computer network systems, often constitute many separate computer units or servers, which can be positioned and stacked in a rack. The various computer servers in the system are electrically interconnected to each other and provide various functions, such as storage, communications, calculations, and others. The rack includes a plurality of support columns, attached to which are opposing slide assemblies securing each computer server. The slide assemblies allow the server to be pulled away from the front of the rack, providing access to each separate server for maintenance, card replacement, or other operations. The rack may also need to be moved for cleaning or maintenance. However, the rack, due to frequently excessive height, can be unstable during moving.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
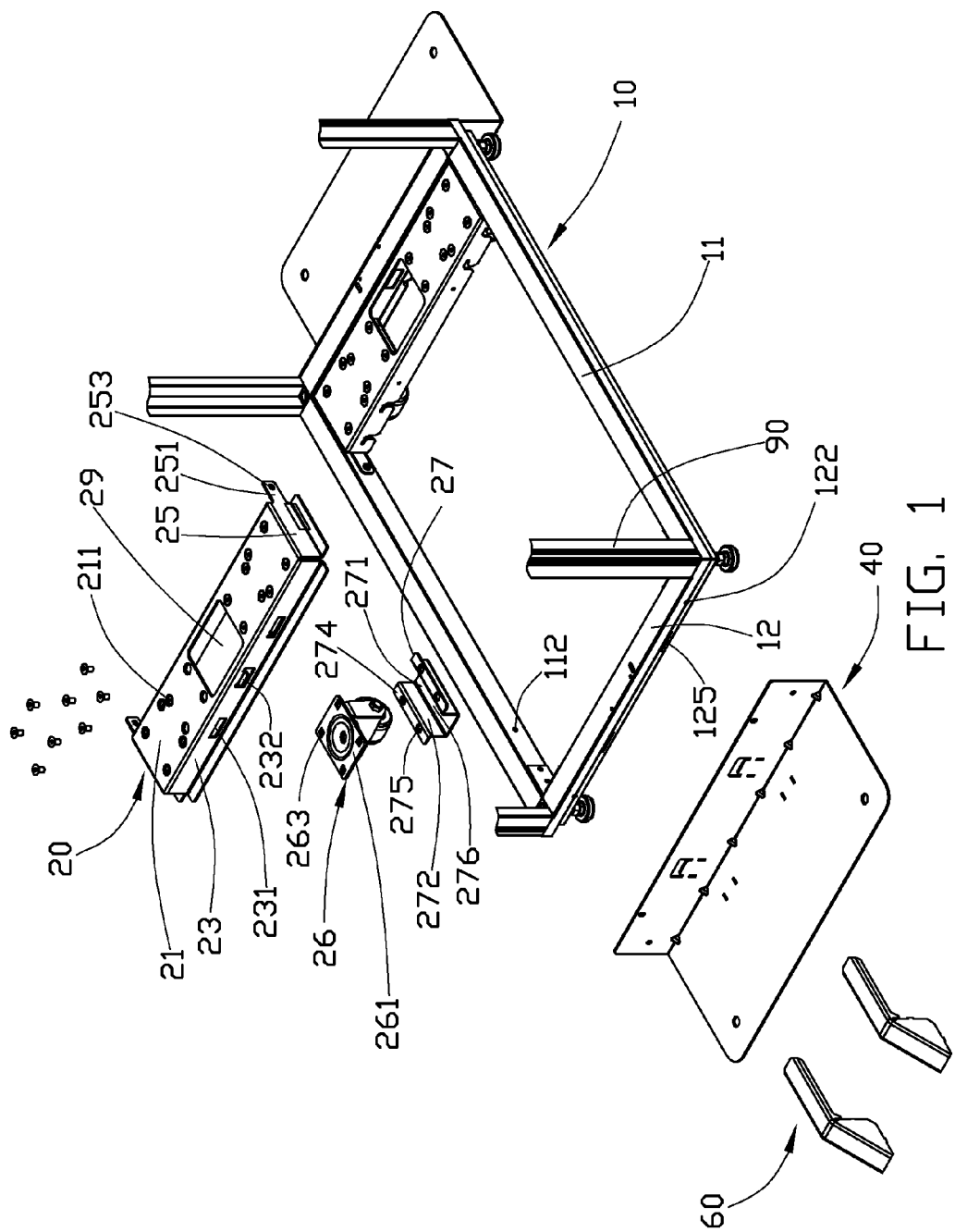
FIG. 1 is an isometric and exploded view of a rack for electronic apparatus in accordance with one embodiment.
Figure 2:
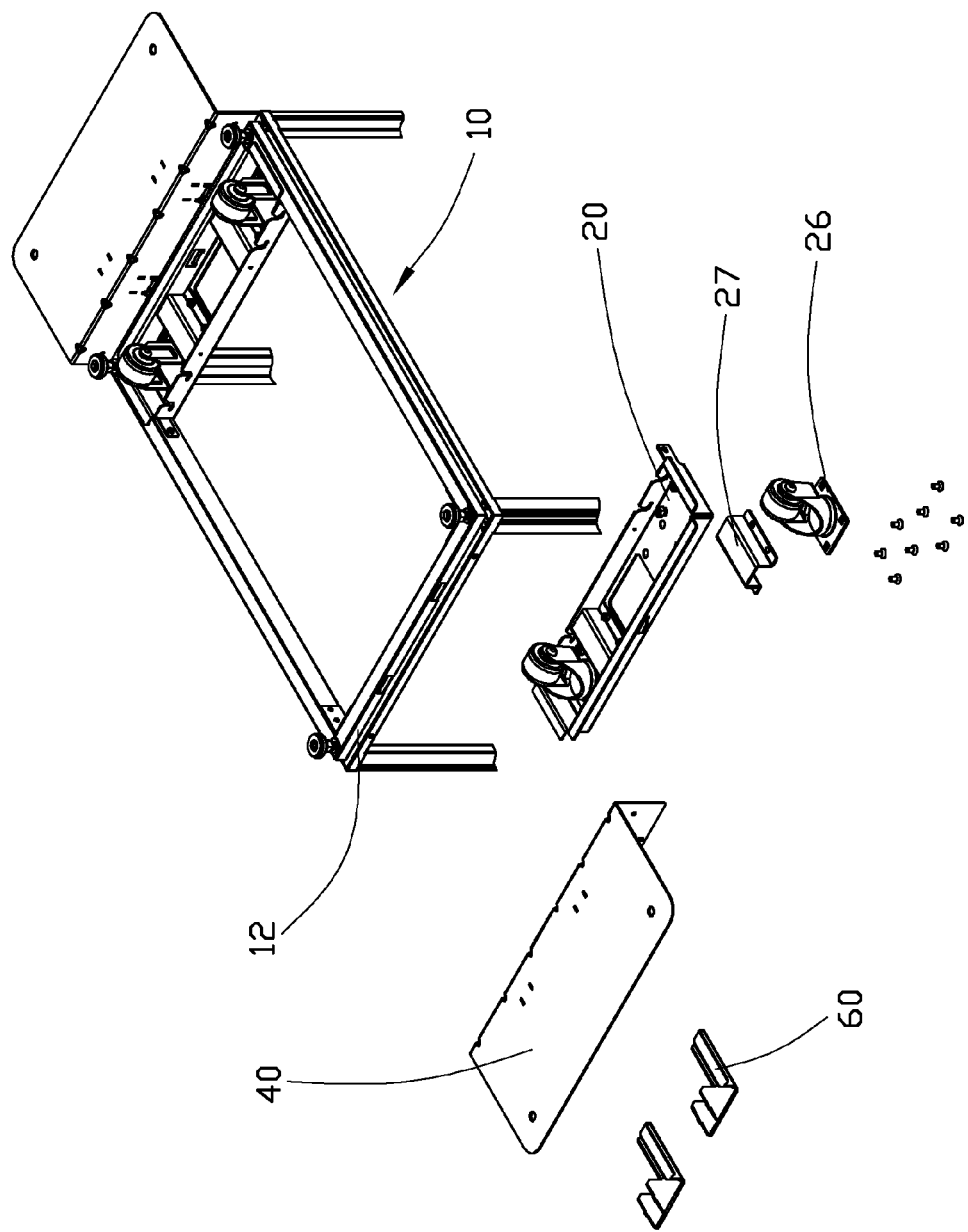
FIG. 2 is similar to FIG. 1, but viewed from another aspect.

Referring to FIGS. 1 and 2, a rack for electronic apparatus includes a lower frame 10 and four vertical frame profiles 90. The lower frame 10 is rectangular. Each corner of the lower frame 10 mounts a frame profile 90 thereon. The lower frame 10 includes a pair of long first pillars 11 and a pair of short second pillars 12. An inner side of the first pillar 11 defines a plurality of first securing holes 112. An outer side of the second pillar 12 defines a plurality of second securing holes 122 and a pair of first openings 125.

A pair of mounting brackets 20 is mounted in the lower frame 10. Each mounting bracket 20 includes a horizontal mounting piece 21. A plurality of third securing holes 211 is defined in the mounting piece 21. A front piece 23 depends from the mounting piece 21 and defines a pair of second openings 231 corresponding to the pair of first openings 125. A tongue piece 232 is located between the pair of second openings 231. A pair of side pieces 25 depend respectively from left and right sides of the mounting piece 21. Each side piece 25 includes a extending portion 253 which is connected to a rear portion of the side piece 25. A fourth securing hole 253 is defined in the extending portion 253. The mounting piece 21, the front piece 23, the pair of side pieces 25 together define a receiving room 29 thereamong.

A pair of wheels 26 is mounted in the receiving room 29 of the mounting bracket 20. Each wheel 26 includes an attaching board 261. Four corners of the attaching board 261 define four first screw holes 263.

A pair of restricting members 27 is mounted in the receiving room 29 of the mounting bracket 20. Each restricting member 27 includes a bottom wall 271. A pair of side walls 272 is connected to opposite edges of the bottom wall 271. An upper edge of each side wall 272 extends horizontally to form a flange 274. The flange 274 defines a pair of second screw holes 275. The bottom wall 271 and pair of side walls 272 surround a restricting space 276 thereamong.

Figure 3:
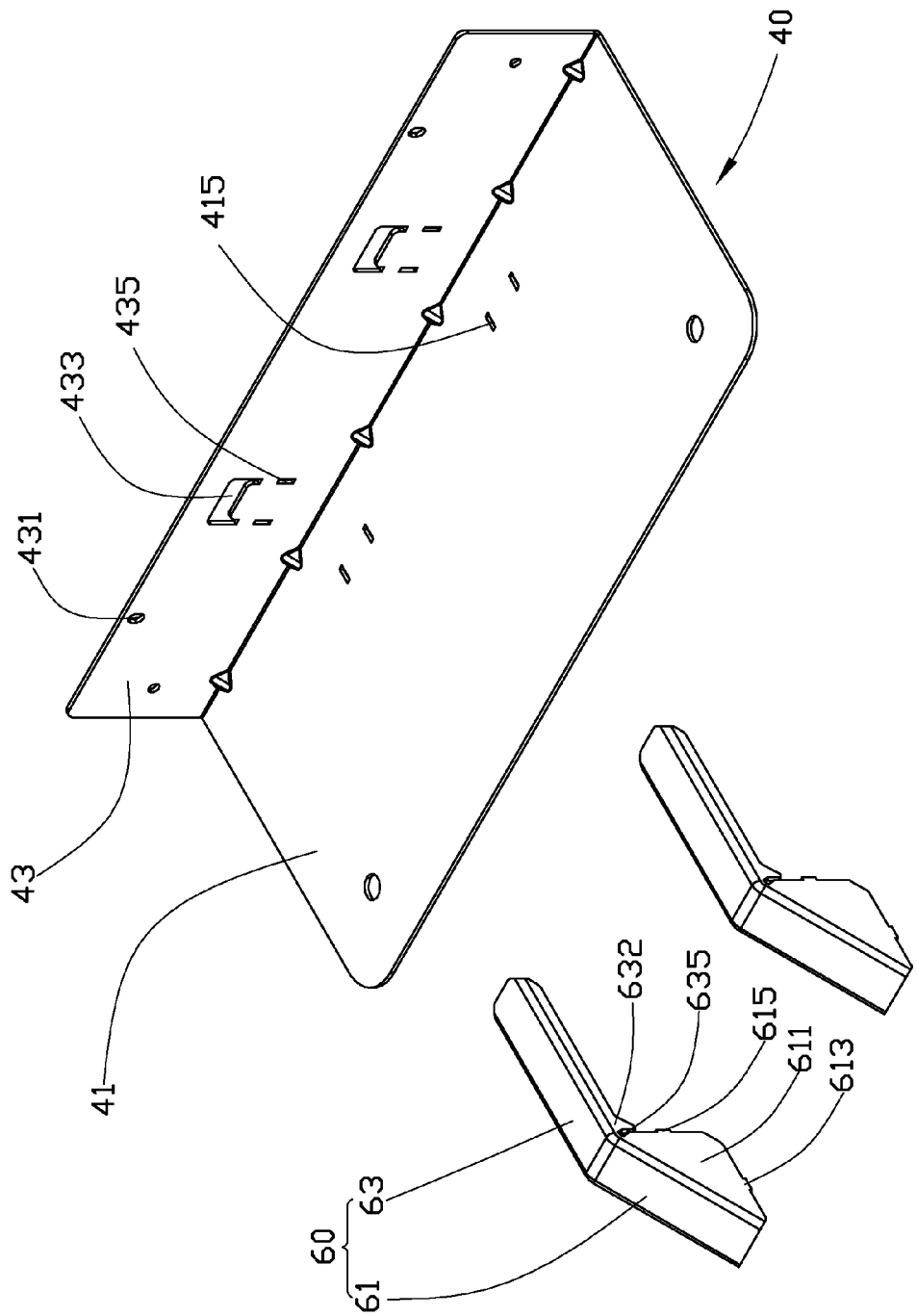
FIG. 3 is an isometric view of a stand member and two feet of the rack of FIG. 1.
Figure 4:
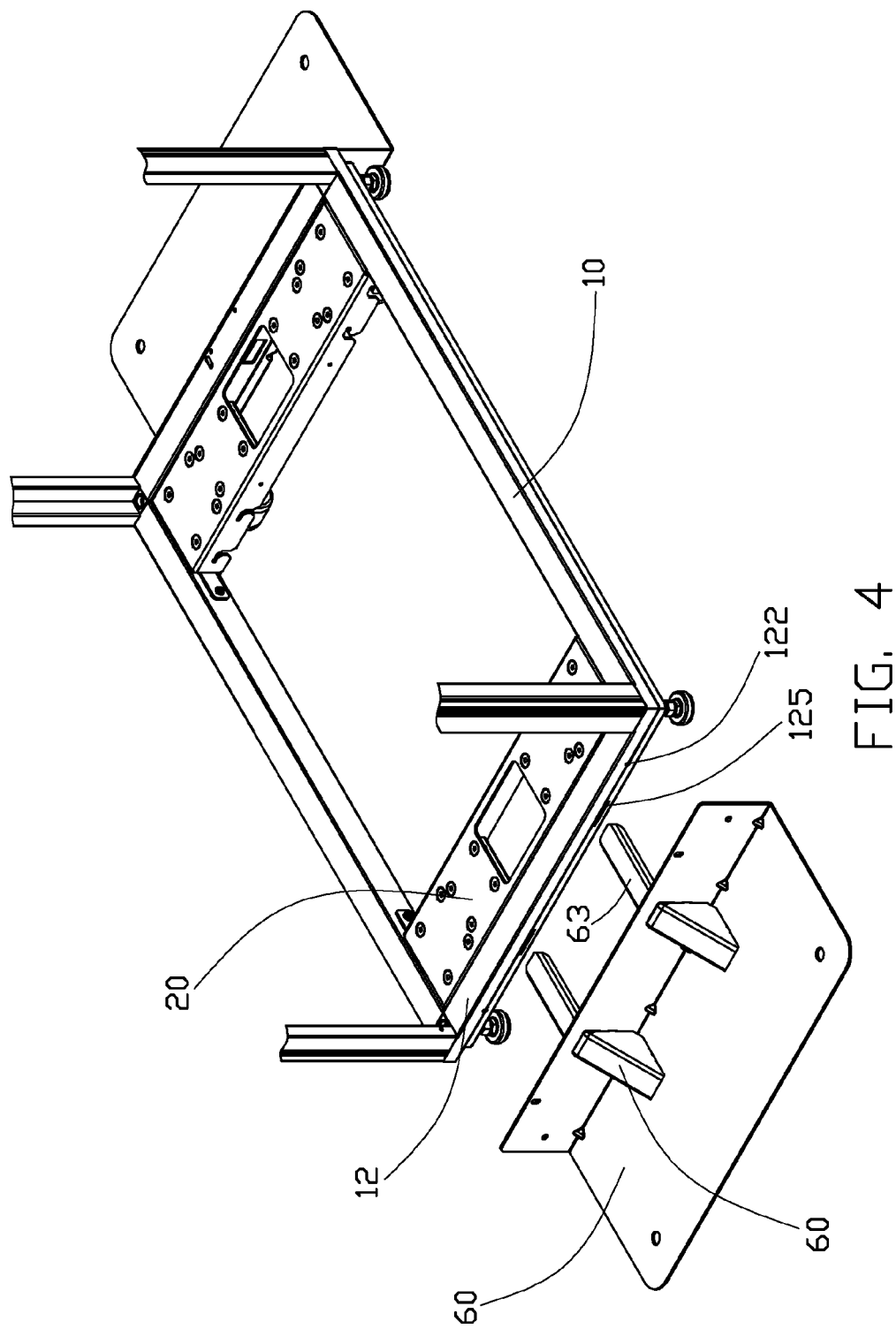
FIG. 4 is a partly assembled view of the rack of FIG. 1.
Figure 5:
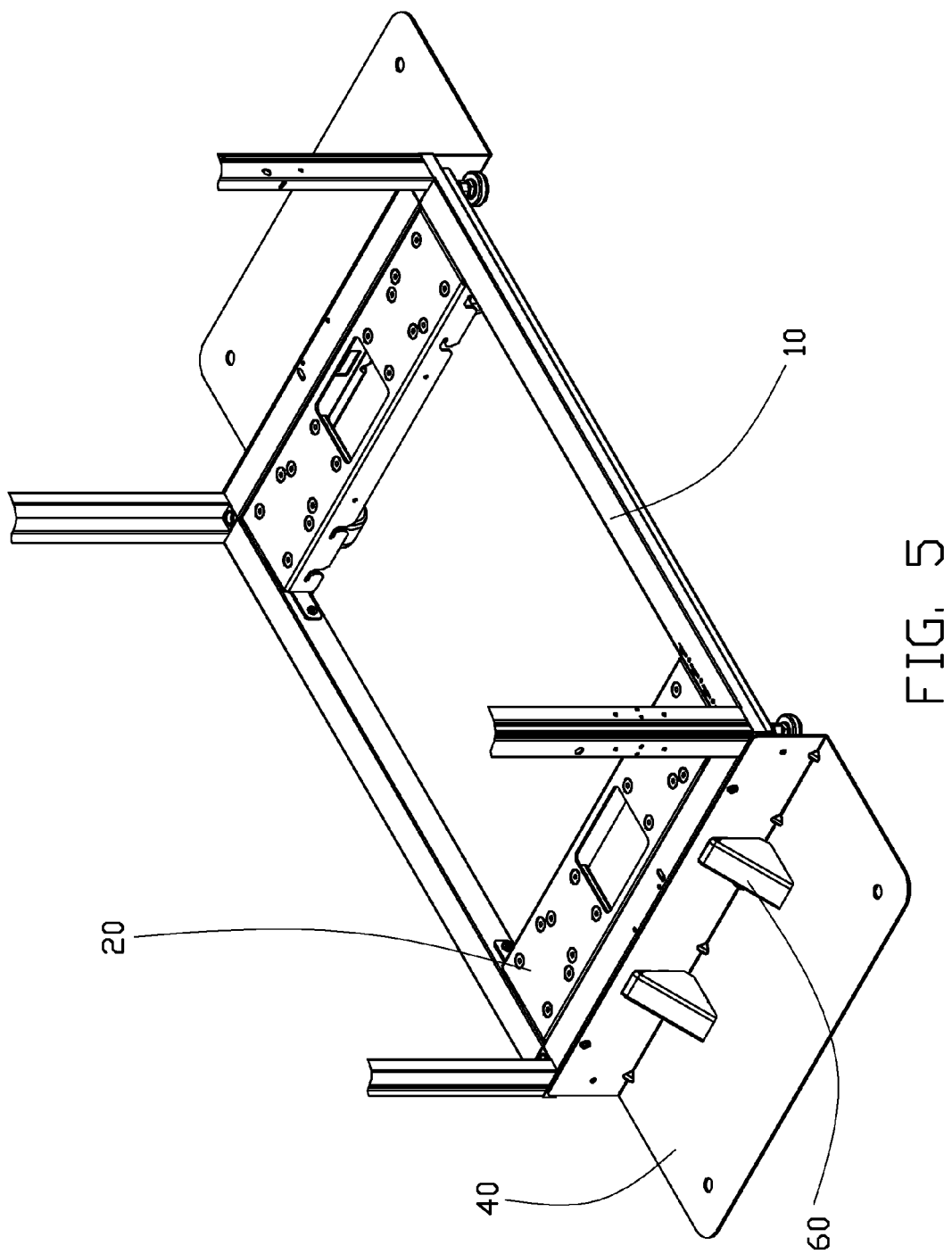
FIG. 5 is an assembled view of the rack of FIG. 1.

Referring to FIGS. 1 and 3, a pair of stand members 40 is mounted on the pair of second pillar 12. Each stand member 40 includes a horizontal base 41 and an upright connecting plate 43 connected with the base 41. The connecting plate 43 defines a plurality of fifth securing holes 431 and a pair of third openings 433. Two pairs of first positioning slots 435 are defined below the pair of third openings 433. The base 41 defines two pairs of second positioning slots 415 corresponding to the two pairs of first positioning slots 435.

A pair of feet 60 is mounted on the stand member 40. Each foot 60 includes an inclined support portion 61 and a horizontal inserter 63. The inserter 63 extends from an upper section of the support portion 61. A pair of triangular support pieces 611 is coupled with opposite edges of the support portion 61. A second positioning tab 613 is connected to a bottom portion of each support piece 611. A first positioning tab 615 is connected to an edge of the support piece 611 which is directed towards the stand member 40. A protrusion 632 is located on the inserter 63, and adjacent to the support piece 611. A gap 635 is defined between the support piece 611 and the protrusion 632.

Referring to FIGS. 1 to 5, in assembly of the rack, the attaching board 261 of the wheel 26 is placed in the receiving room 29 of the mounting bracket 20. The first screw holes 263 of the attaching board 261 are in alignment with the third securing holes 211 of the mounting bracket 20. A plurality of fasteners is secured in the first screw holes 263 and the third securing holes 211. The wheel 26 is mounted on the mounting bracket 20. The restricting member 27 is placed in the receiving room 29, so that the second screw holes 275 are in alignment with the third securing holes 211. Simultaneously, the restricting space 276 is aligned with the second opening 231 of the mounting bracket 20. A plurality of fasteners is secured in the second screw holes 275 and the third securing holes 211 to mount the restricting member 27 on the mounting bracket 20.

The mounting bracket 20 is then placed between the pair of first pillars 11. The fourth securing holes 253 are aligned with the first securing holes 112. Simultaneously, the second openings 231 of the mounting bracket 20 are aligned with the first openings 125 of the second pillar 12. A plurality of fasteners is secured in the first securing holes 112 and the fourth securing holes 253 to mount the mounting bracket 20 on the first pillars 11.

The inserter 63 of the foot 60 is received in the third opening 433 of the stand member 40. An edge of the third opening 433 is received in the gap 635 of the foot 60. The first positioning tab 615 is received in the first positioning slot 435. The second positioning tab 613 is received in the second positioning slot 415. The stand member 40 with the foot 60 is moved towards the second pillar 12. The inserters 63 of the foot 60 are received in the first opening 125 and the second opening 231, and positioned in the restricting space 276. At this position, the fifth securing holes 431 of the stand member 40 are aligned with the second securing holes 122 of the second pillar 12. A plurality of fasteners is secured in the second securing holes 122 and fifth securing holes 431 to mount the stand member 40 on the second pillar 12.

The base 41 is slightly higher than a bottom of the wheel 26. Therefore, the wheels 26 can turn easily. The stand member 40 and the foot 60 are configured to stabilize the rack during moving.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A rack, comprising:
   a lower frame, a wheel mounted on the lower frame; and
   a stand member comprising a base and a connecting plate, the connecting plate secured to the lower frame, and the base located higher than a bottom of the wheel to stabilize the rack during moving;
   the lower frame defines a first opening; the base is located in a horizontal plane, the connecting plate is located in a vertical plane, the connecting plate defines a third opening; a foot comprises a support portion and an inserter, the support portion is supported by the base, and the inserter is received in the third opening and the first opening.

2. The rack of claim 1, wherein the support portion is inclined with respect to the connecting plate, a support piece is connected to an edge of the support portion, the support piece comprises a first positioning tab and a second positioning tab; the connecting plate defines a first positioning slot, the base defines a second positioning slot; and the first positioning tab is positioned in the first positioning slot, and the second positioning tab is positioned in the second positioning slot.

3. The rack of claim 2, wherein the inserter comprises a protrusion adjacent the support piece, a gap is defined between the protrusion and the support piece, and an edge of the third opening is received in the gap.

4. The rack of claim 1, wherein a mounting bracket is mounted on the lower frame, the mounting bracket defines a second opening, and the inserter is received in the second opening.

5. The rack of claim 4, wherein a restricting member is mounted on the mounting bracket, the restricting member defines a restricting space in alignment with the second opening, and the inserter is received in the restricting space.

6. The rack of claim 4, wherein the mounting bracket comprises a horizontal mounting piece and a pair of upright side pieces connected to the horizontal mounting piece, the pair of upright side pieces is secured on the lower frame, and the wheel is mounted on the horizontal mounting piece.

7. A rack, comprising:
   a lower frame defining a first opening, a wheel mounted on the lower frame, and
   a foot comprising a support portion and an inserter, the support portion being inclined with respect to the inserter, the inserter is connected to an upper section of the support portion, the inserter is received in the first opening, and the support portion is located higher than a bottom of the wheel to stabilize the rack during moving.

8. The rack of claim 7, further comprising a stand member, wherein the stand member comprises a base and a connecting plate, the connecting plate is secured to the lower frame, the connecting plate defines a third opening in alignment with the first opening, the inserter is received in the third opening, and the support portion is supported by the base.

9. The rack of claim 8, wherein a support piece is connected to an edge of the support portion, the support piece comprises a first positioning tab and a second positioning tab; the connecting plate defines a first positioning slot, the base defines a second positioning slot; and the first positioning tab is positioned in the first positioning slot, and the second positioning tab is positioned in the second positioning slot.

10. The rack of claim 9, wherein the inserter comprises a protrusion adjacent the support piece, a gap is defined between the protrusion and the support piece, and an edge of the third opening is received in the gap.

11. The rack of claim 7, wherein a mounting bracket is mounted on the lower frame, the mounting bracket defines a second opening, and the inserter is received in the second opening.

12. The rack of claim 11, wherein a restricting member is mounted on the mounting bracket, the restricting member defines a restricting space in alignment with the second opening, and the inserter is received in the restricting space.

13. The rack of claim 11, wherein the mounting bracket comprises a horizontal mounting piece and a pair of upright side pieces connected to the horizontal mounting piece, the pair of upright side pieces is secured on the lower frame, and the wheel is mounted on the horizontal mounting piece.

14. A rack, comprising:
   a lower frame with a wheel mounted thereon;
   a stand member comprising a base and a connecting plate, the connecting plate stationarily secured to the lower frame, and the base located higher than a bottom of the wheel to stabilize the rack during moving, the connecting plate defining a first positioning slot, the base defining a second positioning slot; and
   a foot comprising a support piece, the support piece comprising a first positioning tab extending in a first direction and a second positioning tab extending in a second direction perpendicular to the first direction, wherein the first positioning tab is inserted in the first positioning slot in the first direction, the second positioning tab is inserted in the second positioning slot in the second direction.

15. The rack of claim 14, wherein the lower frame defines a first opening, the connecting plate defines a third opening in alignment with the first opening; the foot comprises an inserter, and the inserter is inserted in the third opening and the first opening.

16. The rack of claim 15, wherein the foot further comprises a support portion which is inclined with respect to the connecting plate, the support piece is connected to an edge of the support portion, and the support portion is located on the base.

* * * * *